(12) United States Patent
Zeng et al.

(10) Patent No.: US 12,740,012 B2
(45) Date of Patent: Sep. 15, 2026

(54) LIQUID COOLING SERVER AND CASING FOR LIQUID COOLING SERVER

(71) Applicants: SQ TECHNOLOGY (SHANGHAI) CORPORATION, Shanghai (CN); INVENTEC CORPORATION, Taipei (TW)

(72) Inventors: Boheng Zeng, Shanghai (CN); Hong-Chou Lin, Taipei (TW); Yu-Fan Chen, Taipei (TW)

(73) Assignees: SQ TECHNOLOGY (SHANGHAI) CORPORATION, Shanghai (CN); INVENTEC CORPORATION, Taipei (TW)

( * ) Notice: Subject to any disclaimer, the term of this patent is extended or adjusted under 35 U.S.C. 154(b) by 294 days.

(21) Appl. No.: 18/748,089

(22) Filed: Jun. 20, 2024

(65) Prior Publication Data

US 2025/0358956 A1 Nov. 20, 2025

(30) Foreign Application Priority Data

May 15, 2024 (CN) ......................... 202410607225.7

(51) Int. Cl.
*H05K 7/20* (2006.01)

(52) U.S. Cl.
CPC ..... *H05K 7/20272* (2013.01); *H05K 7/20772* (2013.01)

(58) Field of Classification Search
CPC ...... G06F 1/20; G06F 2200/201; G06F 1/206; G06F 1/181; H05K 7/20772; H05K 7/20272; H05K 7/20236; H05K 7/20781; H05K 7/20281; H05K 7/203; H05K 7/20809; H05K 7/20218; H05K 7/20263; H05K 7/20254; H05K 7/20727; H05K 7/20736; H05K 7/20818; H05K 7/20836; H05K 1/0203; H05K 5/061; H05K 7/20; H05K 7/20327; H05K 7/20436; H10W 40/47; F28D 2021/0031; F28D 1/02;
(Continued)

(56) References Cited

U.S. PATENT DOCUMENTS 5,731,954 A * 3/1998 Cheon ....................... G06F 1/20 174/15.1
6,234,240 B1 * 5/2001 Cheon ....................... G06F 1/20 165/185

(Continued)

*Primary Examiner* — Michael A Matey

(57) ABSTRACT

A liquid cooling server and a casing are provided. The liquid cooling server includes a first housing provided with a first receiving cavity and a cable hole in communication with the first receiving cavity, the first receiving cavity being configured to receive a computing element and coolant immersing the computing element, and the cable hole being configured to allow a transmission cable to extend through; a second housing provided on a side of the first housing and fixedly connected to the first housing, the second housing being provided with a second receiving cavity in communication with the cable hole, and the second receiving cavity being configured to receive an I/O module; and a liquid anti-leakage assembly provided in the cable hole, and the liquid anti-leakage assembly being configured to tightly press the transmission cable to isolate the first receiving cavity from the second receiving cavity.

12 Claims, 6 Drawing Sheets

(58) Field of Classification Search
CPC ......... F28D 1/0206; F16L 37/00; F16L 37/26; F16L 37/30; F28F 9/0258
See application file for complete search history.

(56) References Cited

U.S. PATENT DOCUMENTS

| | | | | |
|---|---|---|---|---|
| 6,970,351 | B2 * | 11/2005 | Perez | G06F 1/181 361/679.57 |
| 7,961,475 | B2 * | 6/2011 | Campbell | H05K 7/20772 361/752 |
| 8,289,729 | B2 * | 10/2012 | Lieberman | G06F 1/26 361/810 |
| 12,150,276 | B2 * | 11/2024 | Wang | H05K 7/20318 |
| 2002/0117291 | A1 * | 8/2002 | Cheon | G06F 1/20 165/80.4 |
| 2004/0008483 | A1 * | 1/2004 | Cheon | G06F 1/20 361/699 |
| 2005/0083656 | A1 * | 4/2005 | Hamman | F28D 15/00 361/689 |
| 2006/0067047 | A1 * | 3/2006 | Pfahnl | G06Q 20/20 361/679.48 |
| 2014/0218859 | A1 * | 8/2014 | Shelnutt | H05K 7/20809 361/679.46 |
| 2018/0027695 | A1 * | 1/2018 | Wakino | H05K 7/20772 361/699 |
| 2019/0246523 | A1 * | 8/2019 | Boyden | H05K 7/20445 |
| 2022/0095481 | A1 * | 3/2022 | Ma | H05K 7/20236 |
| 2022/0110225 | A1 * | 4/2022 | Edmunds | H05K 7/20772 |
| 2022/0124942 | A1 * | 4/2022 | Tan | H05K 7/20272 |
| 2022/0369514 | A1 * | 11/2022 | Heydari | H05K 7/20272 |

* cited by examiner

LIQUID COOLING SERVER AND CASING FOR LIQUID COOLING SERVER

CROSS-REFERENCE TO RELATED APPLICATIONS

This application claims priority of Chinese Patent Application No. 2024106072257, filed on May 15, 2024, entitled "LIQUID COOLING SERVER AND CASING FOR LIQUID COOLING SERVER", the entire content of which is incorporated herein in its entirety.

TECHNICAL FIELD

The present disclosure relates to servers, and in particular to a liquid cooling server and a casing for a liquid cooling server.

BACKGROUND

With the development of technologies such as the Internet of Things and 5G, the speed and scale of data generation continue to expand, and the need to process and analyze data in real time is becoming more and more urgent. In the era of new data centers, cloud computing and edge computing are cooperated to form a distributed computing system, which can effectively improve data processing speed and reduce network latency. As such, edge computing devices need to have higher computing power and lower power consumption to adapt to large-scale distributed deployment. Therefore, high-efficiency and energy-saving liquid cooling technology emerges, and gradually becomes a key way to solve the energy efficiency problem of new data centers.

In order to reduce the amount of coolant, coolant is injected into a casing to immerse heat generating elements, so as to dissipate heat from the heat generating elements. However, the problem of how to prevent liquid leakage at a location where the data transmission cable is located while an I/O module in the casing achieves data transmission needs to be solved urgently.

SUMMARY

According to various embodiments, a liquid cooling server and a casing for a liquid cooling server are provided.

According to a first aspect, a casing for a liquid cooling server is provided, including a first housing provided with a first receiving cavity and a cable hole in communication with the first receiving cavity, the first receiving cavity being configured to receive a computing element and coolant immersing the computing element, and the cable hole being configured to allow a transmission cable to extend through; a second housing provided on a side of the first housing and fixedly connected to the first housing, the second housing being provided with a second receiving cavity in communication with the cable hole, and the second receiving cavity being configured to receive an I/O module connected to the computing element through the transmission cable; and a liquid anti-leakage assembly provided in the cable hole, and the liquid anti-leakage assembly being configured to tightly press the transmission cable to isolate the first receiving cavity from the second receiving cavity.

In one of the embodiments, the liquid anti-leakage assembly includes a cable gland, the cable gland includes a first connecting end received in the cable hole and sealingly fitted a hole wall of the cable hole, and the cable gland is provided with a first through hole configured to allow the transmission cable to extend through.

In one of the embodiments, the liquid anti-leakage assembly further includes a sealing member received in the first through hole, an outer peripheral surface of the sealing member is sealingly fitted with a hole wall of the first through hole, the sealing member is provided with a second through hole configured to allow the transmission cable to extend through, and the second through hole is in communication with the first through hole.

In one of the embodiments, a plurality of second through holes are provided, and the plurality of second through holes are spaced apart along a circumferential direction of the sealing member, so as to be arranged in one-to-one correspondence with a plurality of transmission cables.

In one of the embodiments, the cable gland further includes a second connecting end, the second connecting end and the first connecting end are respectively located at both ends of the cable gland along an axial direction thereof, a side of the second connecting end away from the first connecting end is provided with a plurality of first elastic arms, the plurality of first elastic arms spaced apart along a circumferential direction of the cable gland, and the sealing member is provided in a space surrounded by the plurality of first elastic arms.

In one of the embodiments, the liquid anti-leakage assembly further includes a nut sleeved on the first elastic arms, and the nut is threadedly connected to the second connecting end.

In one of the embodiments, the casing further includes an assisting handle provided on a side of the second housing away from the first housing.

In one of the embodiments, the assisting handle includes a first end and a second end that are opposite to each other, the first end is rotatably connected to the second housing and is provided with a locking groove configured to be engaged with a cabinet, a groove wall of the locking groove is provided with two first avoidance openings at both ends thereof along a width direction of the assisting handle, and the second end is detachably connected to the second housing.

In one of the embodiments, the second housing is provided with a receiving groove, the receiving groove includes a first groove wall and a second groove wall that are opposite to each other, the first groove wall is provided away from the first housing relative to the second groove wall, the first groove wall is provided with a second avoidance opening, and the first end is received in the receiving groove through the second avoidance opening.

In one of the embodiments, the second housing further includes a connecting shaft provided in the receiving groove and an elastic member sleeve on the connecting shaft, both ends of the connecting shaft are connected to two groove walls between the first groove wall and the second groove wall, respectively, the elastic member includes a second elastic arm and a third elastic arm that are located at two ends thereof, the second elastic arm abuts against the second housing, and the third elastic arm abuts against the assisting handle.

In one of the embodiments, a groove bottom of the receiving groove is horizontally arranged, and the second groove wall is inclined from the groove bottom to a groove opening of the receiving groove in a direction adjacent to the first housing.

According to a second aspect, a server is further provided, including the aforementioned casing.

According to the aforementioned liquid cooling server and the casing, the liquid anti-leakage assembly is provided in the cable hole, the liquid anti-leakage assembly can tightly press the transmission cable, so as to isolate the first receiving cavity from the second receiving cavity, so that the coolant in the first receiving cavity can be prevented from entering the second receiving cavity through the cable hole to affect the functions of the I/O module, thereby prolonging the service life of the liquid cooling server.

The details of one or more embodiments of the present disclosure are set forth in the accompanying drawings and the description below. Other features, objects and advantages of the present disclosure will become apparent from the description, the accompanying drawings, and the claims.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DESCRIPTION OF REFERENCE SIGNS

Figure 1:
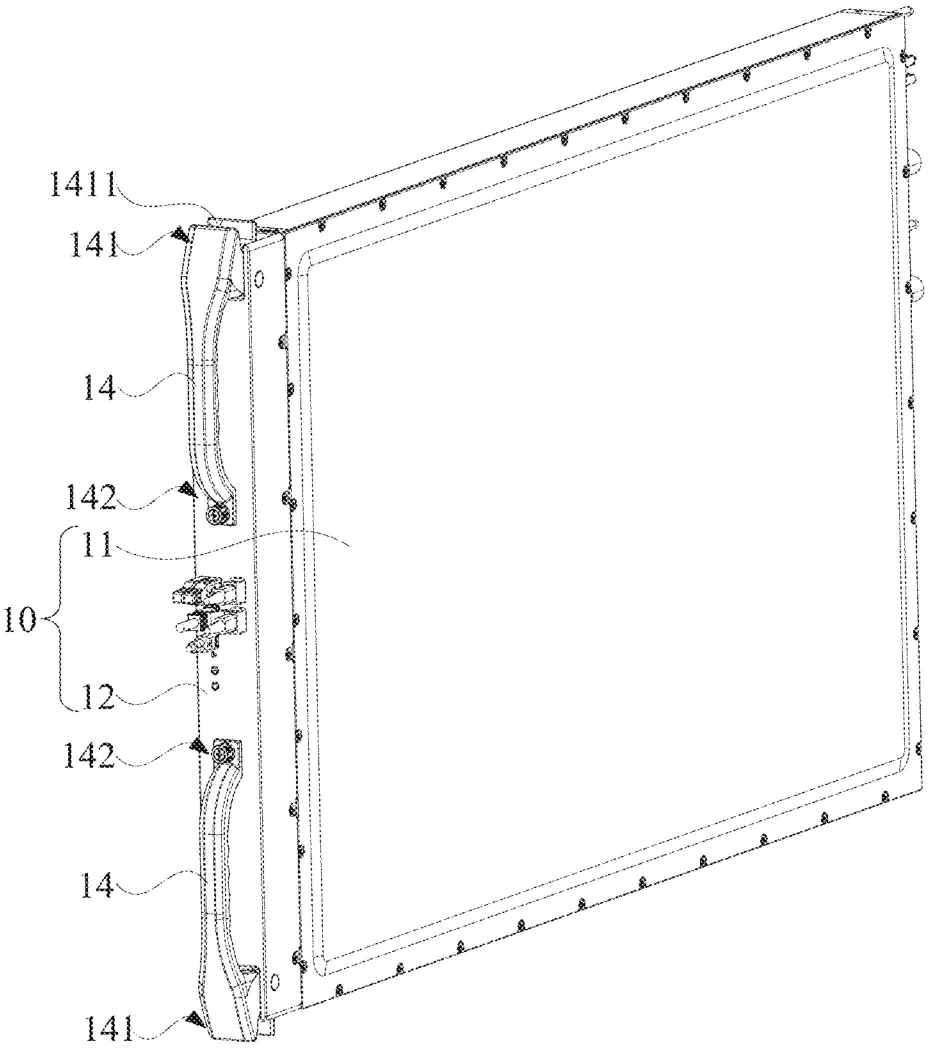
FIG. 1 is a perspective view of a liquid cooling server according to an embodiment of the present disclosure.

10. Casing; 11. First housing; 111. First receiving cavity; 112. Cable hole; 12. Second housing; 121. Second receiving cavity; 122. Receiving groove; 1221. First groove wall; 1222. Second groove wall; 1223. Second avoidance opening; 123. Connecting lug; 124. Second shaft hole; 13. Liquid anti-leakage assembly; 131. Cable gland; 1311. First connecting end; 1312. Second connecting end; 1313. First through hole; 1314. First elastic arm; 132. Sealing member; 1321. Second through hole; 133. Nut; 14. Assisting handle; 141. First end; 1411. Locking groove; 1412. First avoidance opening; 1413. First shaft hole; 142. Second end; 1421. First mounting hole; 15. Connecting shaft; 16. Elastic member; 161. Second elastic arm; 162. Third elastic arm; 17. Mounting member; 20. I/O module; 21. I/O function board.

DETAILED DESCRIPTION OF THE EMBODIMENTS

In order to make the above objects, features and advantages of the present disclosure clear and easier to understand, the specific embodiments of the present disclosure are described in detail below in combination with the accompanying drawings. Many specific details are set forth in the following description to facilitate a full understanding of the present disclosure. However, the present disclosure can be implemented in many ways different from those described herein, and those skilled in the art can make similar improvements without departing from the connotation of the present disclosure. Therefore, the present disclosure is not limited by the specific embodiments disclosed below.

In the description of the present disclosure, it should be understood that the terms “center”, “longitudinal”, “transverse”, “length”, “width”, “thickness”, “upper”, “lower”, “front”, “rear”, “left”, “right”, “vertical”, “horizontal”, “top”, “bottom”, “inner”, “outer”, “clockwise”, “counterclockwise”, “axial”, “radial”, “circumferential direction” are based on the azimuth or position relationship shown in the attached drawings, which are only for the convenience of describing the present disclosure and simplifying the description, rather than indicating or implying that the device or element must have a specific azimuth, be constructed and operated in a specific azimuth, so such terms cannot be understood as a limitation of the present disclosure.

In addition, the terms “first” and “second” are only used for descriptive purposes and cannot be understood as indicating or implying relative importance or implicitly indicating the number of indicated technical features. Thus, the features defined with “first” and “second” may explicitly or implicitly include at least one of the features. In the description of the present disclosure, “a plurality of” means at least two, such as two, three, etc., unless otherwise expressly and specifically defined.

In the present disclosure, unless otherwise expressly specified and limited, the terms “mount”, “connect”, “contact”, “fix” and other terms should be understood in a broad sense, for example, they can be fixed connections, detachable connections, or integrated. They can be mechanical connection or electrical connection. They can be directly connected or indirectly connected through an intermediate medium. They can be the connection within two elements or the interaction relationship between two elements, unless otherwise expressly limited. For those skilled in the art, the specific meaning of the above terms in the present disclosure can be understood according to the specific situation.

In the present disclosure, unless otherwise expressly specified and limited, the first feature “above” or “below” the second feature may be in direct contact with the first and second features, or the first and second features may be in indirect contact through an intermediate medium. Moreover, the first feature is “above” the second feature, but the first feature is directly above or diagonally above the second feature, or it only means that the horizontal height of the first feature is higher than the second feature. The first feature is “below” of the second feature, which can mean that the first feature is directly below or obliquely below the second feature, or simply that the horizontal height of the first feature is less than that of the second feature.

It should be noted that when an element is called “fixed to” or “provided on” another element, it can be directly on another element or there can be a centered element. When an element is considered to be “connected” to another element, it can be directly connected to another element or there may be intermediate elements at the same time. The terms “vertical”, “horizontal”, “up”, “down”, “left”, “right” and similar expressions used herein are for the purpose of illustration only and do not represent the only embodiment.

Referring to FIG. 1, a liquid cooling server is provided according to an embodiment of the present disclosure. The liquid cooling server includes a casing 10 suitable for the field of immersion liquid cooling.

Figure 2:
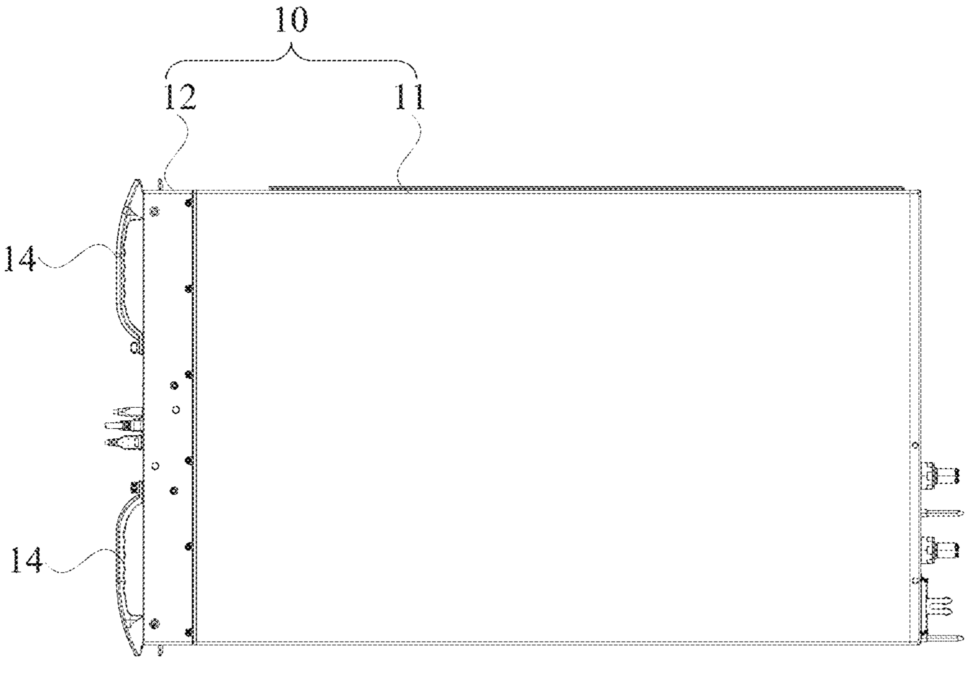
FIG. 2 is a front view of the liquid cooling server of FIG. 1.
Figure 3:
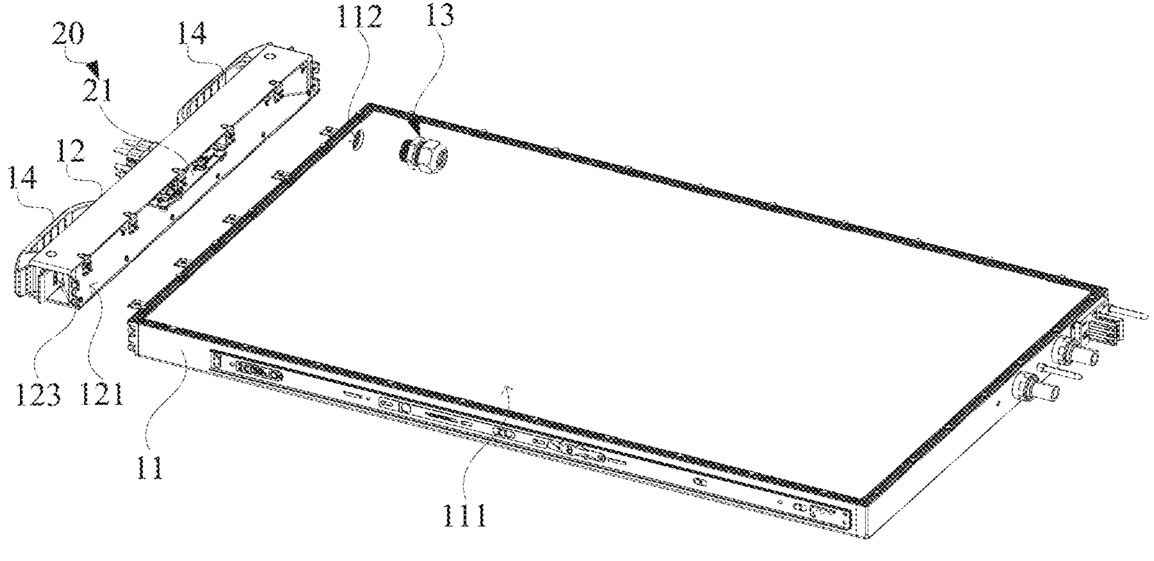
FIG. 3 is an exploded view of the liquid cooling server of FIG. 1.

In an embodiment, referring to FIGS. 2 and 3, the casing 10 includes a first housing 11 and a second housing 12. The first housing 11 is provided with a first receiving cavity 111 configured to receive a computing element. The second housing 12 is provided on a side of the first housing 11 and fixedly connected to the first housing 11. The second housing 12 is provided with a second receiving cavity 121 configured to receiving an I/O module 20.

Specifically, the computing element includes a CPU (Central Processing Unit), a GPU (Graphics Processing Unit), etc. During operation, the computing element generates a large amount of heat due to computing, so that coolant is supplied to the first receiving cavity 111 to immerse the computing element in the coolant, so as to dissipate heat from the computing element. The first housing 11 may be understood as a wet area.

The I/O module 20 includes an I/O function board 21. A side of the second housing 12 away from the first housing 11 is provided with an adapter hole. An optical fiber adapter is provided in the adapter hole, and the optical fiber adapter is connected to the I/O function board 21. In operation, since the I/O module 20 generates less heat, it is not necessary to use the coolant for cooling. The second housing 12 may be understood as a dry area. A dry-wet separation structure is adopted, which can effectively reduce the amount of coolant.

In order to facilitate the connection between the computing element and the I/O module 20, a side of the first housing 11 connected to the second housing 12 is provided with a cable hole 112, which is in communication with the first receiving cavity 111 and the second receiving cavity 121 simultaneously. During assembly, a transmission cable (not shown) is provided in the cable hole 112, one end of the transmission cable is located in the first receiving cavity 111 and connected to the computing element, and the other end of the transmission cable is located in the second receiving cavity 121 and connected to the I/O module 20, so as to achieve data transmission.

It should be noted that the number of transmission cables can be configured according to the actual requirements, which is not specifically limited herein. In this embodiment, six transmission cables are provided, including a USB (Universal Serial Bus/Power Button) cable, a VGA (Video Graphics Array) cable, a NIC (network interface card) cable, a PWR/I2C cable, and two 100G optical fiber cables. The optical fiber cables are connected to the optical fiber adapter.

In an embodiment, referring to FIG. 3, the casing 10 further includes a liquid anti-leakage assembly 13 provided in the cable hole 112. The liquid anti-leakage assembly 13 is configured to tightly press the transmission cable, so as to isolate the first receiving cavity 111 from the second receiving cavity 121. Since the liquid anti-leakage assembly 13 is provided in the cable hole 112, the coolant in the first receiving cavity 111 can be prevented from entering the second receiving cavity 121 through the cable hole 112 to affect the functions of the I/O module, thereby prolonging the service life of the liquid cooling server.

Figure 4:
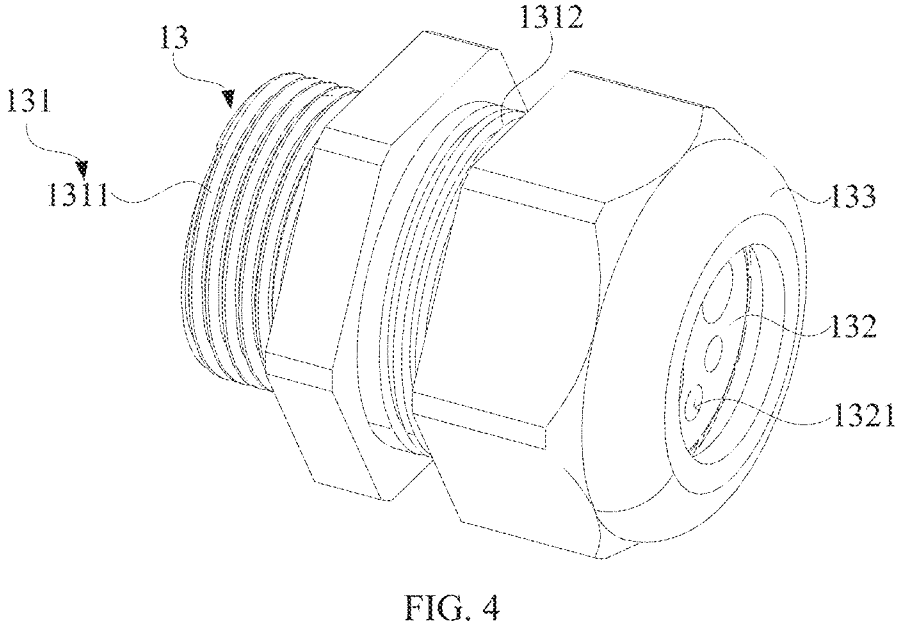
FIG. 4 is an enlarged view of a liquid anti-leakage assembly shown in FIG. 3.
Figure 5:
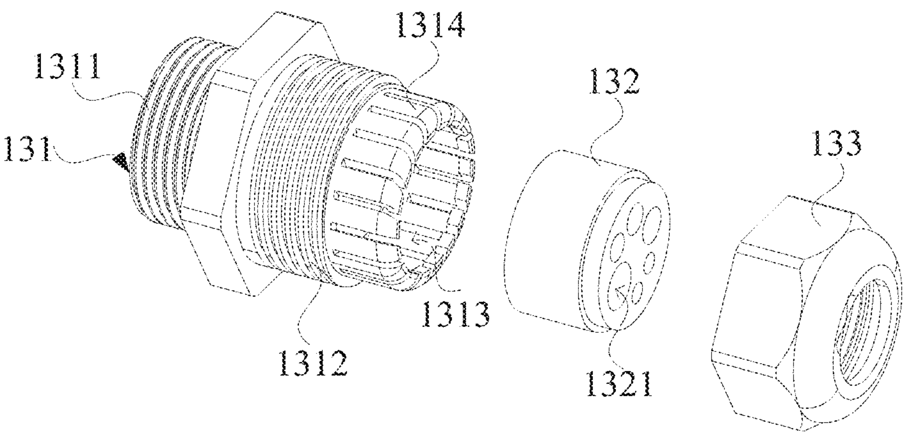
FIG. 5 is an exploded view of the liquid anti-leakage assembly of FIG. 4.

In an embodiment, referring to FIGS. 3 to 5, the liquid anti-leakage assembly 13 includes a cable gland 131, a sealing member 132, and a nut 133. The cable gland 131 includes a first connecting end 1311 received in the cable hole 112 and sealingly fitted a hole wall of the cable hole 112. The cable gland 131 is provided with a first through hole 1313 configured to allow the transmission cable to extend through. During assembly, the transmission cable is arranged in the first through hole 1313, one end of the transmission cable is located in the first receiving cavity 111 and connected to the computing element, and the other end of the transmission cable is located in the second receiving cavity 121 and connected to the I/O module 20. The cable grant 131 can seal the transmission cable to prevent the coolant in the first receiving cavity 111 from entering the second receiving cavity 121 through the cable hole 112 and affecting the function of the I/O module. In addition, the cable gland 131 can fix the transmission cable to avoid axial displacement and radial rotation of the transmission cable, so as to ensure that both ends of the transmission cable are normally connected to the computing element and the I/O module 20, respectively.

In an embodiment, the hole wall of the cable hole 112 is provided with an inner thread. An outer peripheral surface of the first connecting end 1311 is provided with a threaded section, and the threaded section is threadedly engaged with the inner thread of the hole wall of the cable hole 112. The cable gland 131 is mounted on the first housing 11 in a threaded connection manner, which facilitates the disassembly and assembly of the cable gland 131, and further facilitates the disassembly and assembly of the transmission cable.

In an embodiment, referring to FIGS. 3 to 5, the sealing member 132 is received in the first through hole 1313. An outer peripheral surface of the sealing member 132 is sealingly fitted with a hole wall of the first through hole 1313. The sealing member 132 is provided with a second through hole 1321 configured to allow the transmission cable to extend through. In this way, the sealing member 132 is arranged in the first through hole 1313, the sealing member 132 can further seal the transmission cable, which can more effectively isolate the first receiving cavity 111 from the second receiving cavity 121, and more effectively prevent the coolant in the first receiving cavity 111 from entering the second receiving cavity 121 through the cable hole 112 and affecting the function of the I/O module.

In an embodiment, the sealing member 132 is made of rubber, and an outer peripheral surface of the rubber seal ring abuts against the hole wall of the first through hole 1313. In other embodiments, the sealing member 132 may be made of other materials.

The number of the second through holes 1321 is the same as the number of the transmission cables, and a diameter of each second through holes 1321 is equal to an outer diameter of the transmission cable to be mounted. During assembly, the transmission cables are arranged in the second through holes 1321 in a one-to-one correspondence, and the hole walls of the second through holes 1321 wrap the outer peripheral surfaces of the transmission cables, so as to avoid liquid leakage due to a gap between adjacent two transmission cables and improve the sealing effect.

In this embodiment, referring to FIG. 5, six second through holes 1321 are provided. The six second through holes 1321 are spaced apart along a circumferential direction of the sealing member 132. Six transmission cables are arranged in the six second through holes 1321 in a one-to-one correspondence.

In an embodiment, referring to FIG. 4 and FIG. 5, the cable gland 131 further includes a second connecting end 1312. The second connecting end 1312 and the first connecting end 1311 are respectively located at both ends of the cable gland 131 along an axial direction thereof. A side of the second connecting end 1312 away from the first connecting end 1311 is provided with a plurality of first elastic arms 1314. The plurality of first elastic arms 1314 are spaced apart along a circumferential direction of the cable gland 131. The sealing member 132 is provided in a space surrounded by the plurality of first elastic arms 1314. Further, the nut 133 is sleeved on the first elastic arms 1314. The nut 133 is threadedly connected to the second connecting end 1312. During assembly, an external force acts on the nut 133 to rotate the nut 133, and the nut 133 presses the first elastic arm 1314 during rotation, so that the sealing member 132 is tightened and deformed to tightly press the transmission cable, thereby achieving a sealing effect.

Figure 6:
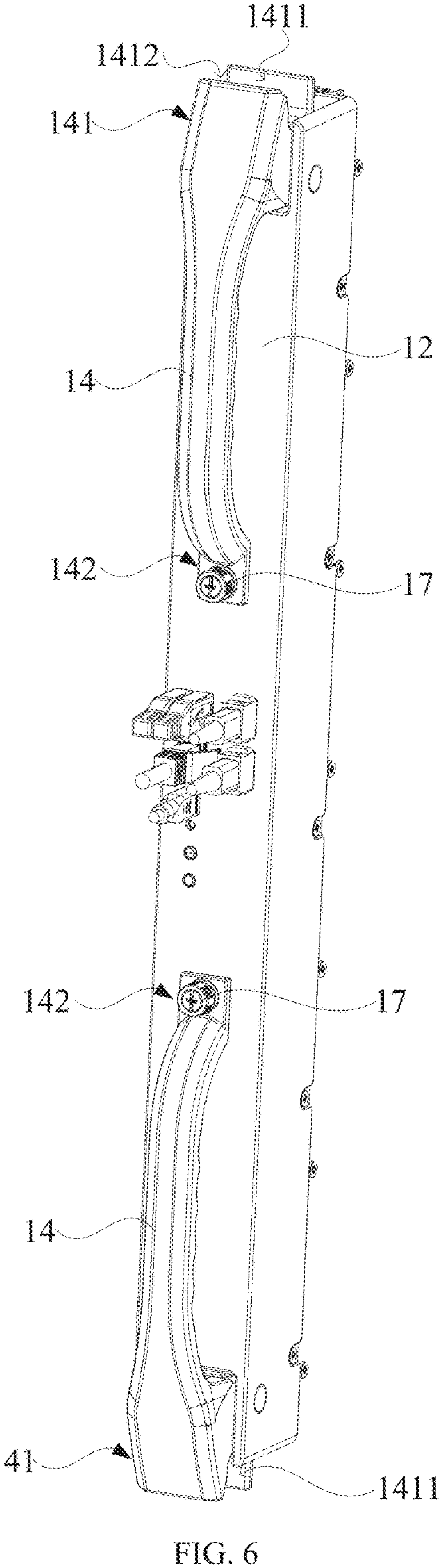
FIG. 6 is a perspective view of a second housing according to an embodiment of the present application.

In an embodiment, referring to FIGS. 1 and 6, the casing 10 further includes an assisting handle 14 provided on a side of the second housing 12 away from the first housing 11. During assembly, the casing 10 is arranged corresponding to an opening of a cabinet, and an external force is applied to the assisting handle 14, so that the casing 10 can be quickly pushed into the cabinet.

It should be noted that the number of the assisting handle 14 can be configured according to actual requirements, which is not specifically limited herein. In this embodiment, referring to FIG. 6, two assisting handles 14 are provided, one assisting handle 14 is provided on an upper portion of the second housing 12, and the other assisting handle 14 is provided on a lower portion of the second housing 12.

Figure 7:
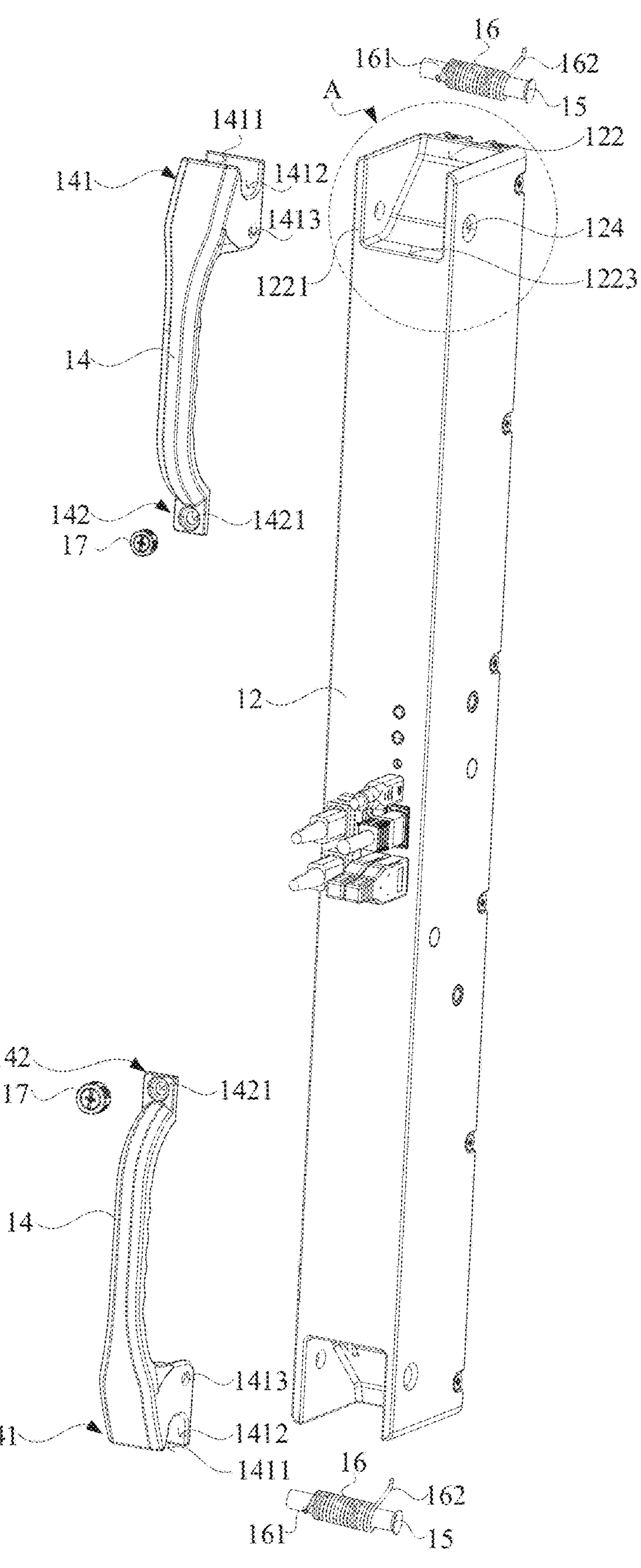
FIG. 7 is an exploded view of the second housing of FIG. 6.

In an embodiment, referring to FIG. 6, the assisting handle 14 includes a first end 141 and a second end 142 that are opposite to each other. Referring to FIG. 6 and FIG. 7, the first end 141 is rotatably connected to the second housing 12 and is provided with a locking groove 1411 configured to be engaged with the cabinet. A notch of the locking groove 1411 is provided away from the second end 142. Alternatively, the first end 141 is rotatably connected to the upper portion or the lower portion of the second housing 12. When the first end 141 is rotatably connected to the upper portion of the second housing 12, the locking groove 1411 is provided upward, so that the locking groove 1411 is engaged with a predetermined position on a top portion of the cabinet. When the second end 142 is rotatably connected to the lower portion of the second housing 12, the locking groove 1411 is provided downward, so that the locking groove 1411 is engaged with a predetermined position of a bottom portion of the cabinet.

Continuing to refer to FIG. 6 and FIG. 7, the second end 142 is detachably connected to the second housing 12. In an embodiment, the second end 142 is provided with a first mounting hole 1421, a side of the second housing 12 away from the first housing 11 is provided with a second mounting hole corresponding to the first mounting hole 1421. A mounting member 17 is provided in the first mounting hole 1421 and the second mounting hole. The mounting member 17 may be a screw.

When the casing 10 is assembled into the cabinet, the mounting member 17 is first disassembled to separate the second end 142 from the second housing 12. Then, the assisting handle 14 is rotated, so that the second end 142 is rotated in a direction away from the second housing 12, and the locking groove 1411 of the first end 141 is engaged with the predetermined position of the cabinet. At this time, the assisting handle 14 servers as a lever arm. Then, the assisting handle 14 is rotated in a reverse direction, so that the second end 142 is rotated in a direction adjacent to the second housing 12. During the process of the second end 142 rotating in the direction adjacent to the second housing 12, the casing 10 is gradually pushed into the cabinet. When casing 10 is fully positioned in the cabinet, the second end 142 is secured to the second housing 12 using the mounting member 17. In this way, the casing 10 is assembled into the cabinet by using the lever principle, so that the labor can be saved, the operation and maintenance can be carried out by one staff, and the manpower can be saved.

Figure 9:
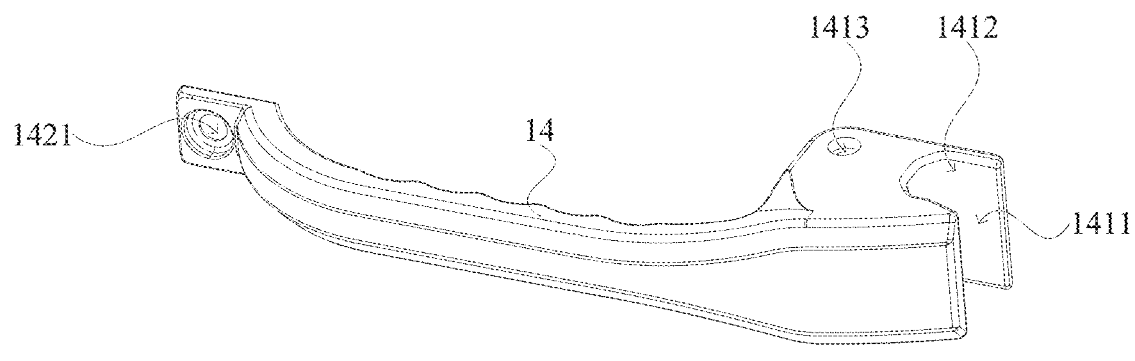
FIG. 9 is a perspective view of an assisting handle shown in FIG. 7.

Further, referring to FIGS. 7 and 9, a groove wall of the locking groove 1411 is provided with two first avoidance openings 1412 at both ends thereof along a width direction of the assisting handle 14. During assembly, the first avoidance opening 1412 can avoid the predetermined position of the cabinet, which is convenient for the locking groove 1411 to be engaged with the predetermined position of the cabinet, so as to avoid that the predetermined position of the cabinet cannot be engaged with the assisting handle 14 due to the interference of the groove wall.

Figure 8:
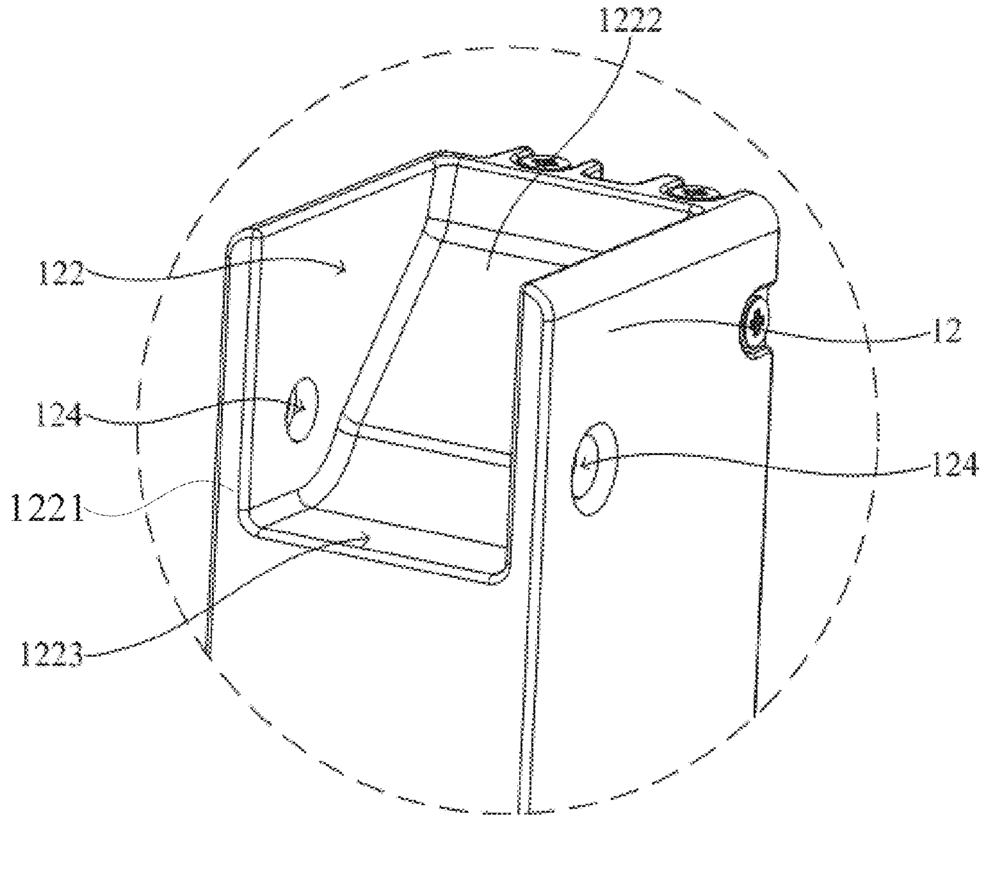
FIG. 8 is an enlarged view of part A in FIG. 7.

In an embodiment, referring to FIGS. 7 and 8, the second housing 12 is provided with a receiving groove 122. The receiving groove 122 includes a first groove wall 1221 and a second groove wall 1222 that are opposite to each other. The first groove wall 1221 is provided away from the first housing 11 relative to the second groove wall 1222. The first groove wall 1221 is provided with a second avoidance opening 1223. The first end 141 is received in the receiving groove 122 through the second avoidance opening 1223. The second avoidance opening 1223 can avoid the first end 141 of the assisting handle 14, so that the first end 141 of the assisting handle 14 can be received in the receiving groove 122 through the second avoidance opening 1223.

Further, referring to FIGS. 7 and 8, the second housing 12 further includes a connecting shaft 15 provided in the receiving groove 122. Both ends of the connecting shaft 15 are connected to two groove walls between the first groove wall 1221 and the second groove wall 1222, respectively. Specifically, the first end 141 is provided with a first shaft hole 1413, the two groove walls between the first groove wall 1221 and the second groove wall 1222 each is provided with a second shaft hole 124, and both ends of the connecting shaft 15 are provided in the first shaft hole 1413 and the second shaft hole 124, respectively. The second housing 12 further an elastic member 16 sleeved on the connecting shaft 15. The elastic member 16 includes a second elastic arm 161 and a third elastic arm 162 that are located at two ends thereof. The second elastic arm 161 abuts against the second housing 12, and the third elastic arm 162 abuts against the assisting handle 14. After the second end 142 of the assisting handle 14 is detached from the second housing 12, the second end 142 of the assisting handle 14 rotates in a direction away from the second housing 12 under the action of the elastic member 16, so that the assisting handle 14 is kept at the maximum opening angle, so as to push the casing 10 into the cabinet.

In an embodiment, the connecting shaft 15 may be a pin, which is not limited hereto.

In an embodiment, referring to FIG. 8, a groove bottom of the receiving groove 122 is horizontally arranged. The second groove wall 1222 is inclined relative to the groove bottom. Specifically, the second groove wall 1222 is inclined from the groove bottom to a groove opening of the receiving groove 122 in a direction adjacent to the first housing 11. During assembly, the assisting handle 14 is rotated to rotate the first end 141 in a direction adjacent to the second groove wall 1222. Since the second groove wall 1222 is inclined from the groove bottom to the groove opening in the direction adjacent to the first housing 11, the inclined second groove wall 1222 provides an avoidance position for the rotation of the assisting handle 14. When the assisting handle 14 rotates until the first end 141 is in contact with the second groove wall 1222, the locking groove 1411 of the first end 141 is inclined forward relative to a pushing direction, so that the locking groove 1411 can be engaged with the predetermined position of the top portion or bottom portion of the cabinet before the casing 10 is pushed into the cabinet. Furthermore, the second groove wall 1222 can also serve as a limiting role to prevent the assisted handle 14 from rotating excessively. In addition, when the locking groove 1411 is engaged with the predetermined position of the cabinet, the first end 141 can abut against the second groove wall 1222, so that the locking groove 1411 of the first end 141 can be quickly engaged with the predetermined position of the cabinet.

In an embodiment, the first housing 11 is detachably connected to the second housing 12. In this way, it is convenient to repair and maintain the I/O module 20, etc. in the liquid cooling server.

In an embodiment, the top portion and the bottom portion of the first housing 11 are provided with first connecting holes. The top portion and the bottom portion of the second housing are each provided with connecting lugs 123, and each connecting lug 123 is provided with a second connecting hole. The casing 10 further includes a plurality of first connecting members engaged in the first connecting holes and the second connecting holes. The first connecting member may be a screw, a bolt, etc. The top portion and bottom portion of the second housing 12 can be detachably connected to the top portion and bottom portion of the first housing 11 respectively by using the first connecting members.

In an embodiment, one side of the first housing 11 along a height direction thereof is provided with a third connecting hole, the other side of the first housing 11 along the height direction thereof is provided with a connecting base, and the connecting base is provided with a fourth connecting hole. The second housing 12 is provided with a fifth connecting hole and a sixth connecting hole on both sides thereof in a height direction thereof. The casing 10 further includes a second connecting member engaged in the third connecting holes and the fifth connecting holes, and a third connecting members engaged in the fourth connecting hole and the sixth connecting hole. The second connecting member and the third connecting member may be screws, bolts, etc. Both sides of the second housing 12 can be detachably connected to both sides of the first housing 11 by using the second connecting member and the third connecting member.

The above-mentioned embodiments do not constitute a limitation on the protection scope of the technical solution. Any modifications, equivalent replacements and improvements made within the spirit and principles of the above-mentioned embodiments shall be included within the protection scope of this technical solution.

The foregoing descriptions are merely specific embodiments of the present disclosure, but are not intended to limit the protection scope of the present disclosure. Any variation or replacement readily figured out by a person skilled in the art within the technical scope disclosed in the present disclosure shall all fall within the protection scope of the present disclosure.

What is claimed is:

1. A casing for a liquid cooling server, comprising:

a first housing provided with a first receiving cavity and a cable hole in communication with the first receiving cavity, the first receiving cavity being configured to receive a computing element and coolant immersing the computing element, and the cable hole being configured to allow a transmission cable to extend through;

a second housing provided on a side of the first housing and fixedly connected to the first housing, the second housing being provided with a second receiving cavity in communication with the cable hole, and the second receiving cavity being configured to receive an I/O module connected to the computing element through the transmission cable; and a liquid anti-leakage assembly provided in the cable hole, and the liquid anti-leakage assembly being configured to tightly press the transmission cable to isolate the first receiving cavity from the second receiving cavity.

2. The casing according to claim 1, wherein the liquid anti-leakage assembly comprises a cable gland, the cable gland comprises a first connecting end received in the cable hole and sealingly fitted a hole wall of the cable hole, and the cable gland is provided with a first through hole configured to allow the transmission cable to extend through.

3. The casing according to claim 2, wherein the liquid anti-leakage assembly further comprises a sealing member received in the first through hole, an outer peripheral surface of the sealing member is sealingly fitted with a hole wall of the first through hole, the sealing member is provided with a second through hole configured to allow the transmission cable to extend through, and the second through hole is in communication with the first through hole.

4. The casing according to claim 3, wherein a plurality of second through holes are provided, and the plurality of second through holes are spaced apart along a circumferential direction of the sealing member, so as to be arranged in one-to-one correspondence with a plurality of transmission cables.

5. The casing according to claim 3, wherein the cable gland further comprises a second connecting end, the second connecting end and the first connecting end are respectively located at both ends of the cable gland along an axial direction thereof, a side of the second connecting end away from the first connecting end is provided with a plurality of first elastic arms, the plurality of first elastic arms spaced apart along a circumferential direction of the cable gland, and the sealing member is provided in a space surrounded by the plurality of first elastic arms.

6. The casing according to claim 5, wherein the liquid anti-leakage assembly further comprises a nut sleeved on the first elastic arms, and the nut is threadedly connected to the second connecting end.

7. The casing according to claim 1, further comprising an assisting handle provided on a side of the second housing away from the first housing.

8. The casing according to claim 7, wherein the assisting handle comprises a first end and a second end that are opposite to each other, the first end is rotatably connected to the second housing and is provided with a locking groove configured to be engaged with a cabinet, a groove wall of the locking groove is provided with two first avoidance openings at both ends thereof along a width direction of the assisting handle, and the second end is detachably connected to the second housing.

9. The casing according to claim 8, wherein the second housing is provided with a receiving groove, the receiving groove comprises a first groove wall and a second groove wall that are opposite to each other, the first groove wall is provided away from the first housing relative to the second groove wall, the first groove wall is provided with a second avoidance opening, and the first end is received in the receiving groove through the second avoidance opening.

10. The casing according to claim 9, wherein the second housing further comprises a connecting shaft provided in the receiving groove and an elastic member sleeve on the connecting shaft, both ends of the connecting shaft are connected to two groove walls between the first groove wall and the second groove wall, respectively, the elastic member comprises a second elastic arm and a third elastic arm that are located at two ends thereof, the second elastic arm abuts against the second housing, and the third elastic arm abuts against the assisting handle.

11. The casing according to claim 10, wherein a groove bottom of the receiving groove is horizontally arranged, and the second groove wall is inclined from the groove bottom to a groove opening of the receiving groove in a direction adjacent to the first housing.

12. A liquid cooling server, comprising the casing according to claim 1.

* * * * *